United States Patent [19]
Gorecki et al.

[11] Patent Number: 5,049,882
[45] Date of Patent: Sep. 17, 1991

[54] HIGH SPEED ANALOG-TO-DIGITAL CONVERTER

[75] Inventors: James L. Gorecki, Vail; Michael J. McGowan, Tucson, both of Ariz.

[73] Assignee: Burr-Brown Corporation, Tucson, Ariz.

[21] Appl. No.: 630,539

[22] Filed: Dec. 20, 1990

[51] Int. Cl.$^5$ ................ H03M 1/36; H03M 1/38
[52] U.S. Cl. ....................... 341/143; 341/159; 341/162
[58] Field of Search ............ 341/143, 159, 162, 155, 341/156, 163, 161, 118

[56] References Cited

U.S. PATENT DOCUMENTS

| | | | |
|---|---|---|---|
| 3,646,586 | 2/1972 | Kurz | 341/163 X |
| 4,214,233 | 7/1980 | Shaw et al. | 341/156 |
| 4,649,371 | 3/1987 | Kolluri | 341/159 |
| 4,684,924 | 8/1987 | Wood | 341/122 |
| 4,745,393 | 5/1988 | Tsukada et al. | 341/136 |
| 4,749,984 | 6/1988 | Prost et al. | 341/156 |
| 4,763,107 | 8/1988 | Koen et al. | 341/156 |
| 4,804,863 | 2/1989 | Welland et al. | 307/227 |
| 4,849,759 | 7/1989 | Hughes | 341/156 |
| 4,875,048 | 10/1989 | Shimizu et al. | 341/156 |
| 4,903,028 | 2/1990 | Fukushima | 341/156 |
| 4,965,579 | 10/1990 | Liu et al. | 341/159 |
| 4,987,417 | 1/1991 | Buckland | 341/155 X |

Primary Examiner—A. D. Pellinen
Assistant Examiner—Sharon D. Logan
Attorney, Agent, or Firm—Cahill, Sutton & Thomas

[57] ABSTRACT

High speed conversion of an analog input signal to a digital output signal is performed by applying the analog input to an input of a unity gain amplifier. During a first pass, an output signal produced by the amplifier is applied to inputs of each of a plurality of comparators. A first group of successively larger reference voltages are applied to reference inputs of the comparators, respectively. A plurality of the comparators switch in response thereto to produce output signals indicative of a range within which the output of the amplifier lies. The outputs of the comparators are encoded to effectuate conversion thereof to an analog representation of the amplifier output. The analog representation is compared to the analog input signal and the difference therebetween is applied to the input of the amplifier. During another pass another group of reference voltages, each substantially lower than corresponding values thereof during the previous pass, are applied to the reference inputs of the comparators. Binary representations of the outputs of the comparators during each of the passes are combined into a binary word accurately representing the analog input signal.

19 Claims, 3 Drawing Sheets

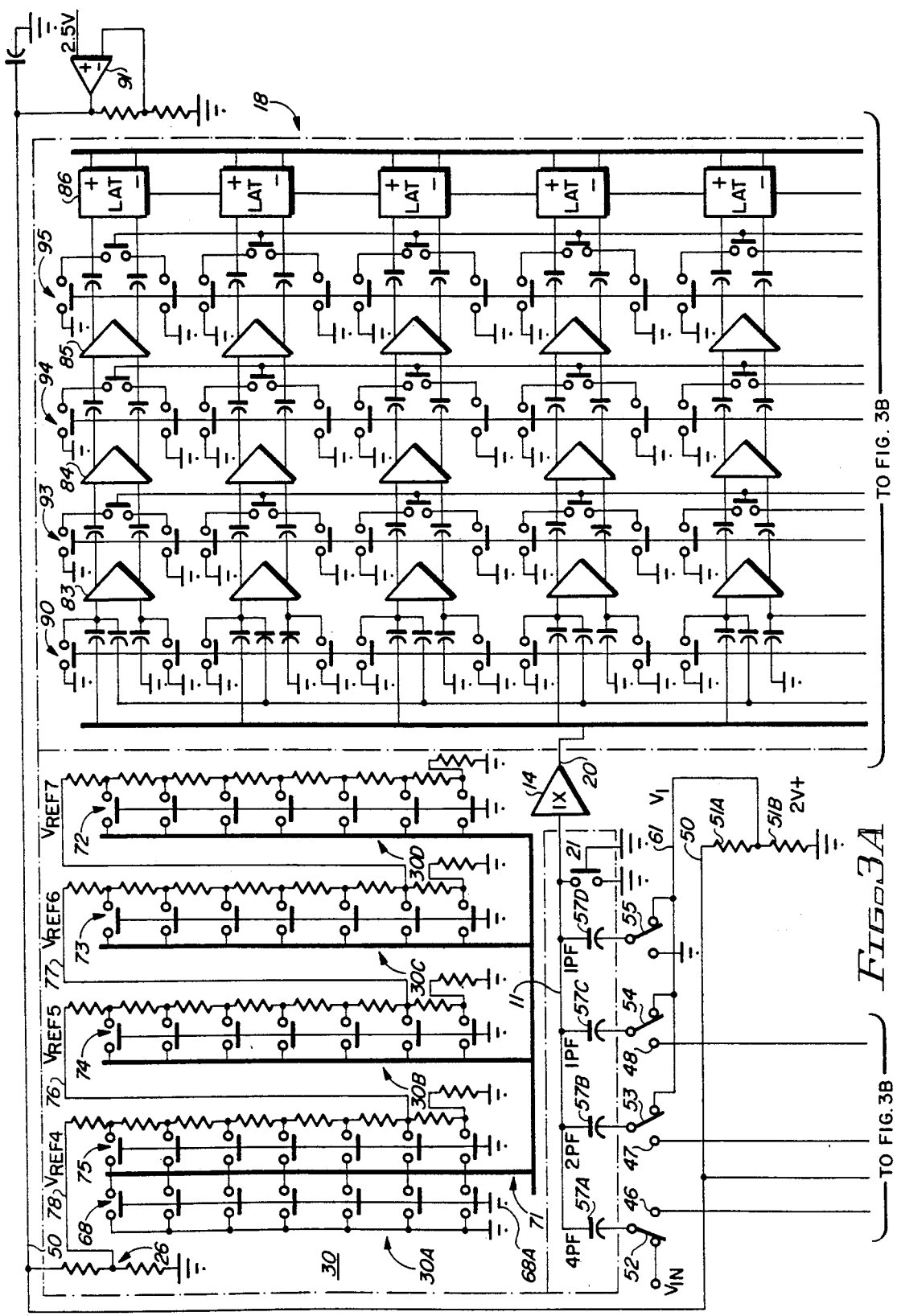

5,049,882

HIGH SPEED ANALOG-TO-DIGITAL CONVERTER

BACKGROUND OF THE INVENTION

The invention relates to high speed analog-to-digital converters, particularly those of the type performing multiple flash encodings of an analog input summed with successive residual voltage voltages obtained by digital-to-analog conversion of successive prior flash encoder outputs.

Various approaches are known for attempting to accomplish high speed analog-to-digital conversion, including use of flash encoders, successive approximation registers (SAR's), and subranging analog-to-digital converters.

FIG. 1 shows a subranging analog-to-digital converter wherein an analog input voltage $V_{IN}$ is applied to the input 2 of an analog summing circuit 10. The output 12 of summing circuit 10 is applied to each of two amplifiers 14 and 16. Amplifier 14 is a unity gain amplifier, and amplifier 16 has a gain of $2^N$, where N is the number of bits of a flash encoder 18 which receives as its analog input the common output 20 of amplifiers 14 and 16 (N=6 in this example).

Six bit flash encoder 18 includes 63 (i.e., $2^N-1$) comparators which establish 64 (i.e., $2^N$) voltage "windows". The reference voltage $V_R$ applied to the six bit flash encoder 18 is constant. The analog voltage on conductor 20 falls into one of those windows. The comparator output signals are encoded to produce a digital six bit word representative of the analog voltage on conductor 20. In operation, there is a "first pass" wherein amplifier 14 multiplies the value of $V_{IN}$ on conductor 12 by unity and applies it to the input of flash encoder 18. The six output lines of flash encoder 18 are applied to the six bits of a high precision six bit DAC 22. The highly accurate analog output signal of six bit DAC 22 is fed by conductor 24 into analog summer 10, which produces an output signal that is equal to the difference between $V_{IN}$ and the voltage on conductor 24.

On the first pass, the most significant six bits of the digital representation of analog input voltage $V_{IN}$ are converted by six bit DAC 22 to a very accurate (e.g., twelve bits of accuracy) analog voltage on conductor 24. The difference between the voltage on conductor 24 (representing the most significant six bits) and the analog input voltage $V_{IN}$ produced on conductor 12 is called a "residual voltage".

On a "second pass" of the operation, the residual voltage on conductor 12 is multiplied by the $2^6$ gain of amplifier 16. The result on conductor 20 is encoded by six bit flash encoder 18, and the encoded result on conductor 40A is taken as the least significant six bits of the desired twelve bit word. Thus, in two passes $V_{IN}$ is converted into a 12 bit digital representation thereof, the six most significant bits being obtained on the first pass and the six least significant bits representing the residual voltage being converted on the second pass.

A major disadvantage of the subranging analog-to-digital converter of FIG. 1 is that its speed of operation is limited by high gain amplifier 16. Those skilled in the art know that in linear amplifier theory there is an inherent tradeoff between an amplifier's gain and its bandwidth. For a given technology (for example CMOS technology) a particular implementation of an amplifier will result in a so-called "gain-bandwidth product" of that amplifier. The gain-bandwidth product for an amplifier is constant, so if its gain is increased, its bandwidth decreases accordingly.

Another disadvantage of the subranging analog-to-digital converter of FIG. 1 is that amplifier 16 is complex and requires careful implementation in CMOS technology.

SUMMARY OF THE INVENTION

Accordingly, it is an object of the invention to provide a low cost, high speed analog-to-digital converter which is faster, less complex, and less expensive than subranging analog-to-digital converters of present state of the art.

It is another object of the invention to provide a high speed, accurate analog-to-digital converter having at least 12 bit accuracy.

Briefly described, and in accordance with one embodiment thereof, the invention provides a system for high speed conversion of an analog input signal to a digital output word. The analog input is applied to an input of a unity gain amplifier. During a first pass, an output signal produced by the amplifier is applied to inputs of each of a plurality of comparators. A first group of successively larger reference voltages are applied to reference inputs of the comparators, respectively. A plurality of the comparators switch in response thereto to produce output signals indicative of a range within which the output of the amplifier lies. The output signals of the comparators are encoded, and the encoded output signals then are converted to an analog representation of the amplifier output. The analog representation is compared to the analog input signal, and the difference therebetween (i.e., the residual voltage) is applied to the input of the amplifier. During subsequent passes other groups of reference voltages, each reference voltage thereof having a substantially lower value than corresponding voltages during the previous pass, are applied to the reference inputs of the comparators. Binary representations of the outputs of the comparators during each of the passes are stored and assembled into a binary digital output word that accurately represents the analog input signal. A CMOS implementation of the invention is disclosed and described in detail.

DETAILED DESCRIPTION OF THE PREFERRED EMBODIMENT

Figure 2:
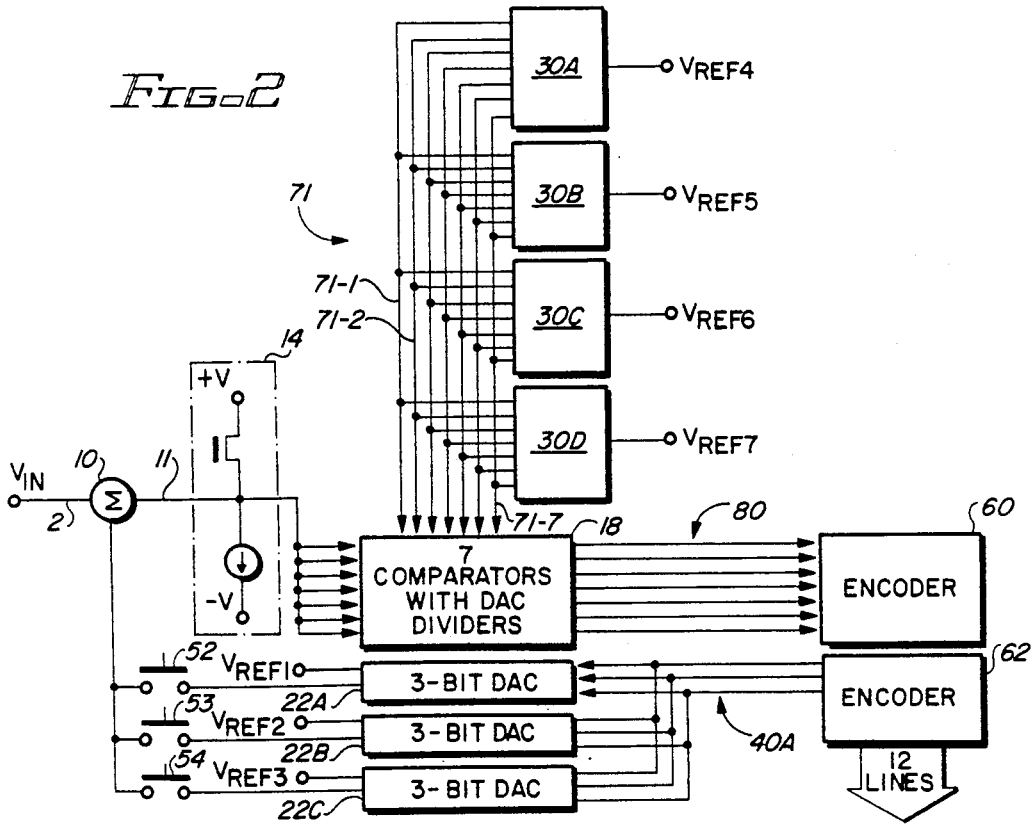
FIG. 2 is a block diagram of the analog-to-digital converter of the present invention.

Referring now to FIG. 2, analog-to-digital converter 1 applies $V_{IN}$ to one input of algebraic summing circuit 10. The other input of summing circuit 10 receives a signal, on conductor 3 from a digital-to-analog converter, subsequently described. The output of summing circuit 10 is applied by conductor 11 to the input of a high speed unity gain amplifier 14. Unity gain amplifier 14 is a simple circuit that can be readily implemented by those skilled in the art. In a CMOS implementation of the invention, a suitable unity gain circuit preferably is a source follower, as shown. The output of amplifier 14 is applied by conductor 20 to the inputs of seven comparators of a three bit flash encoder 18.

In accordance with the present invention, successively lower groups of threshold voltages are input to the seven comparators in flash encoder 18 via seven individual conductors 71-1, 71-2, 71-7, which are collectively referred to by numeral 71. Each of the seven reference voltage conductors 71 is connected to a corresponding output of each of four reference voltage circuits 30-A, 30-B, 30-C, and 30-D, as subsequently described in more detail with reference to FIG. 3. Each of reference voltage circuits 30-A through 30-D produces seven "equally spaced" reference voltages that define threshold voltages of the seven comparators in flash encoder 18. Each of the various reference voltages produced by reference voltage circuit 30-B is one-eighth of the corresponding reference voltage produced by reference voltage circuit 30-A. Similarly, each of the reference voltages produced by reference voltage circuit 30-C is one-eighth of the corresponding reference voltage produced by reference voltage circuit 30-B; and similarly also for reference voltage circuit 4.

The seven outputs 80 of flash encoder 18 are applied to the input of an encoder circuit 60. Encoder circuit 60 performs the function of generating a "switch position" code that is applied via eight conductor bus 40A to three digital-to-analog converters 22-A, 22-B, and 22-C. $V_{REF2}$ is a fraction of $V_{REF1}$, and $V_{REF3}$ is a fraction of $V_{REF2}$. Bus 40A is implemented by eight lines (which represent the eight possible states of three binary bits). Switches 52, 53, and 54 operate to connect the analog output of one of the "three bit" (i.e., eight level) digital-to-analog converters 22A, 22B, or 22C to conductor 3, so that the above-mentioned residual voltage is produced on conductor 11 and reproduced on conductor 20 by unity gain amplifier 14.

The code produced by encoder 60 also is applied to encoder 62, which converts four successive outputs of flash encoder 18 to binary codes that are stored and later used as the three most significant bits, the next three most significant bits, the next three most significant bits, and the three least significant bits of a 12 bit binary output word on bus 39.

Figure 1:
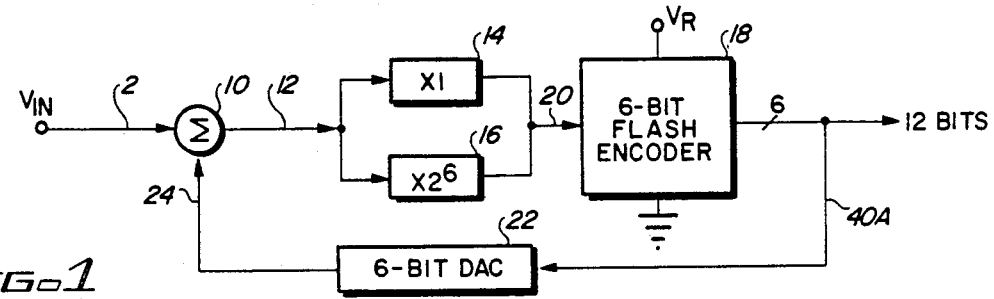
FIG. 1 is a block diagram of a prior art subranging analog-to-digital converter.

In accordance with the present invention, the bandwidth of unitary gain amplifier 14 is very high (e.g., 120 mhz). High bandwidth source followers can e implemented in CMOS integrated circuits quite inexpensively. Instead of providing a plurality of higher gain amplifiers in parallel with unity gain amplifier 14 (as in FIG. 1) formultiple passes that amplify successive residual voltages produced by comparing the analog output of one of three bit DACs 22A-C with the encoded output of flash comparator 18, only one unity gain amplifier 14 is used. Successively lower reference voltages are applied to flash encoder 18 during successive passes to produce the successively lower voltage windows of flash encoder 18. Successively lower reference voltages are applied to the three bit digital-to-analog converters 22A, 22B, and 22C for the first three of the four passes.

Figure 3B:
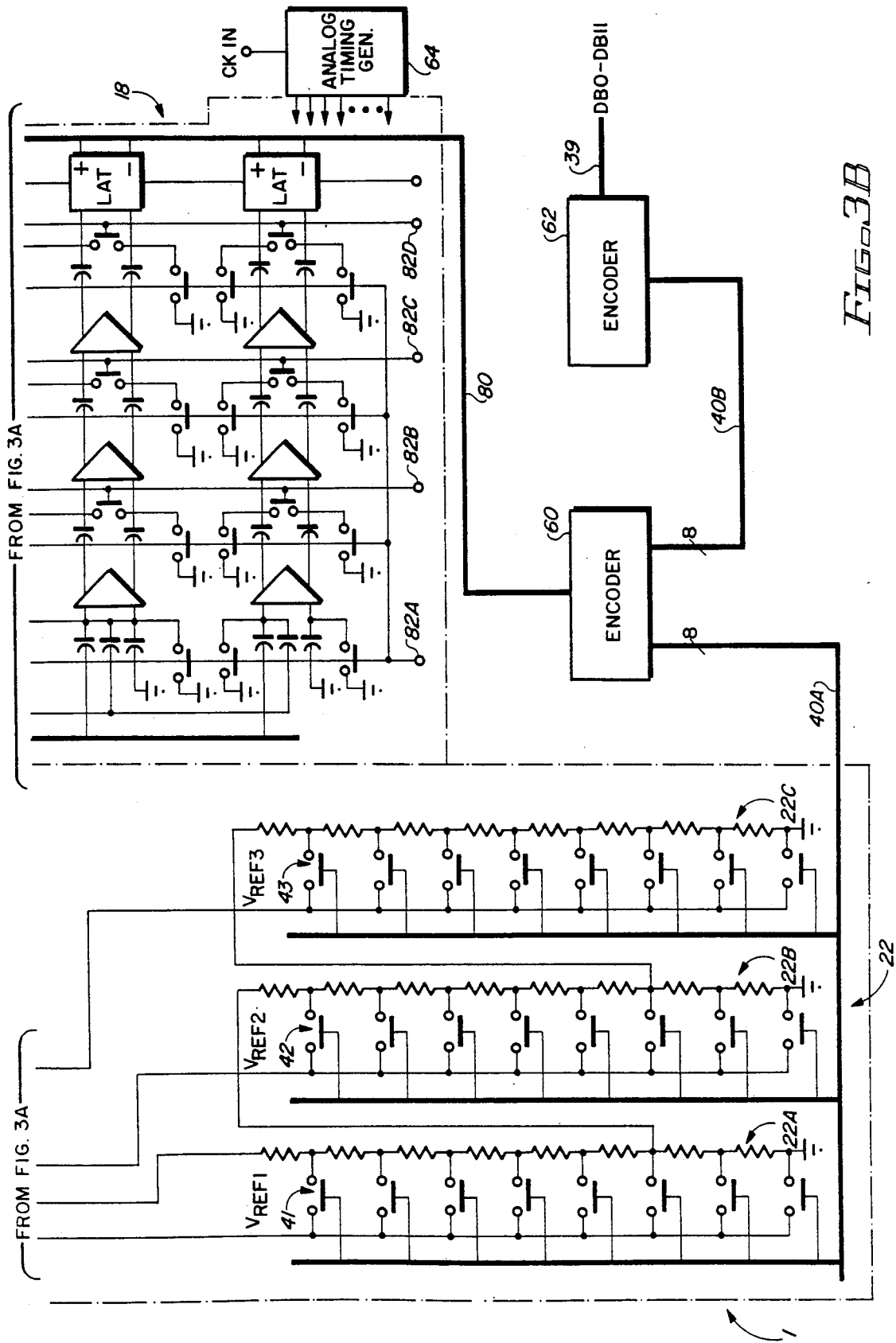
FIG. 3 is a detailed diagram of a practical implementation of the circuit shown in FIG. 2.

Referring to FIG. 3, reference DAC (digital-to-analog converter) 30 includes four cascaded seven-level resistive voltage divider circuits 30A, 30B, 30C, and 30D. Conductor 50 carries a 4 volt reference voltage produced by operational amplifier 91 from an external 2.5 volt reference. A resistive voltage divider 26 divides the 4 volts on conductor 50 down to 2 volts on conductor 78, which is applied to the top of a string of eight equal resistors, the seven various junctions between which are connected by seven switches 75 to the individual conductors of reference voltage bus 71. Switches 75 all are turned on and off in response to a signal on conductor 75A that is produced by control logic circuit 64. Control logic circuit 64 is described in commonly assigned patent application entitled "ANALOG TIMING GENERATOR AND METHOD", U.S. Ser. No. 603,900 filed on Oct. 24, 1990, by Gorecki et al., incorporated herein by reference. Control logic circuit 64 produces all of the control signals needed in analog-to-digital converter 1. Switches 68 connect each of the conductors of reference voltage bus 71 to ground in response to a signal on conductor 68A during an autozero cycle which cancels offsets in the comparators and the level shift voltage drop of the source follower unity gain amplifier 14.

The junction between the bottom two resistors of reference DAC 30A is connected by conductor 76 to the top of the string of eight equal resistors of reference DAC 30B. The lower ends of the strings of resistors of each of DACs 3A-C are connected to ground. Similarly, each of the seven junctions of reference DAC 30B is connected to a separate corresponding conductor of reference bus 71. Reference DACs 30C and 30D are similarly connected, each in effect subdividing the smallest voltage window of the previous DAC into seven smaller sub-windows.

$V_{IN}$ is applied by conductor 2 to one terminal of switch 52, the control terminal of which is connected to one plate of a four picofarad capacitor 57A. The other plate of capacitor 57A is connected to conductor 11 to produce thereon the residual voltage. The other terminal of switch 52 is connected to the output of "three bit" (i.e., 8 level) DAC 22A.

DAC 22A is composed of a string of eight equal series connected resistors (similarly to DACs 30-A through 30-D). The four volt level on conductor 50 is applied across the resistive voltage divider 51A, 51B. The junction between the second and third lowest resistors from the bottom of DAC 22A is connected by conductor 44 to provide the voltage $V_{REF2}$ on the top of a string of series-connected resistors in DAC 22B, which is similarly configured to DAC 22A. $V_{REF3}$ is produced by the junction 45 between the second and third lowest resistors of DAC 22B, and is applied across the resistive string of DAC 22C.

The voltages produced on the output conductors 46, 47, and 48 of DACs 22A, 22B, and 22C, respectively, are selected in response to one of eight switch position signals on bus 40 and one of the eight switches of switch groups 41, 42, and 43, respectively.

The output conductor 46 of DAC 22A is connected to a terminal of switch 52. The output of DAC 22B on conductor 47 is connected to a terminal of switch 53, the other terminal of which is connected to a 2 volt level $V_1$ produced on conductor 61 by voltage divider 51A, 51B. The control terminal of switch 53 is connected to the bottom plate of 2 picofarad capacitor 57B, the top plate of which is connected to residual voltage conductor 11. Similarly, the output 48 of DAC 22C is connected to one terminal of switch 54, another terminal of which is connected to conductor 61. The control terminal of switch 54 is connected to the lower terminal of one picofarad capacitor 57C, the top plate of which is connected to residual voltage conductor 11. Finally, conductor 61 is connected to one terminal of switch 55, the control terminal of which is connected to the bottom plate of 1 picofarad capacitor 57D. The upper plate of capacitor 57D is connected to residual voltage conductor 11. The other terminal of switch 55 is connected to ground. Switch 21 is connected between conductor 11 and ground.

Encoder 60 can be easily implemented by one skilled in the art, for example, by means of a simple lookup table in a PLA (programmed logic array), to produce a one-to-one correspondence between the comparator windows and one of the eight voltage levels selected of DACs 22A-C, depending on which comparator windows $V_{IN}$ the residual voltage lies in. Encoder 62 can be easily implemented in the same fashion.

As in FIG. 2, residual voltage conductor 11 is connected to the input of high speed source follower 14. The output 20 of amplifier 14 is connected to a capacitor $C_c$ (FIG. 4) of each of the seven comparators in flash encoder 18. (Although three cascaded comparators are shown to implement each comparator function in flash encoder 18 in FIG. 3, this is a conventional CMOS implementation of a comparator needed to get the high gain necessary, as each CMOS amplifier stage has a gain of only approximately 8, whereas a gain of roughly 500 is desired.)

Figure 4:
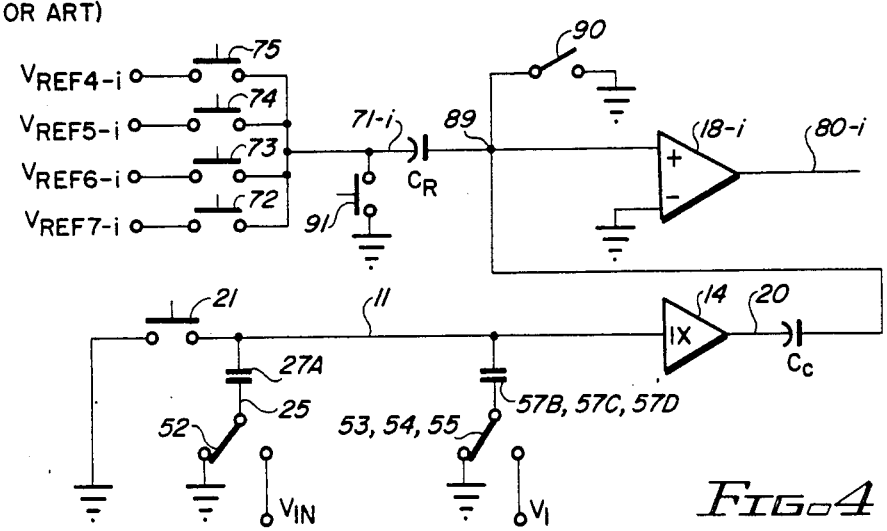
FIG. 4 is a simplified diagram useful in explaining the operation of the comparators in the embodiment of the invention shown in FIG. 3.

The manner in which the comparators operate can best be understood by referring to FIG. 4, wherein numeral 18-$i$ designates one of the three stage "composite" comparators such as 83, 84, 85 shown in FIG. 3. (FIG. 4 is simplified in some respects and more detailed in others compared to the circuitry in FIG. 3 to facilitate description thereof.) The additional capacitor shown at the input of comparator 83 in FIG. 3 (but not shown in FIG. 4 is a dummy capacitor, the operation of which need not be described.) The inverting input of each comparator 18-$i$ is connected to ground, and its non-inverting input is connected by conductor 89 to one terminal of switch 90 and to one terminal of each of capacitors $C_R$ and $C_c$. The other plate of capacitor $C_c$ is connected by conductor 20 to the output of source follower 14, as previously described. The other plate of capacitor $C_R$ is connected to one terminal of grounding switch 91 and also is electrically connected by one of the reference bus conductors 71-$i$ to one terminal of each of the switches 75, 74, 73, and 72 in reference DAC circuit 30 corresponding to conductor 71-$i$. The input of source follower 14 is connected by conductor 11 to one plate of capacitor 57A. The other terminal of capacitor 57A is connected by switch 52 to either ground or an external analog input signal $V_{IN}$. Conductor 11 is connected by switch 21 to ground.

The operation of each comparator 18-$i$ is as follows. All of the switches 21, 52, 90, and 91 are autozeroing switches, and all of the capacitors shown are autozeroing capacitors. The first step in each twelve bit analog-to-digital conversion process is to close switches 21, 52, 90, and 91 to electrically ground conductors 11, 25, 89, and 71-$i$. The offset voltage of source follower 14 (e.g., the $V_{GS}$ voltage) is produced across capacitor $C_c$. Also, all of the remaining autozero switches 93, 94, and 95 (FIG. 4) initially are closed during the autozeroing process. Then, switches 21 and 90 are opened, and any ground voltage errors or the like are stored on capacitors $C_R$ and $C_c$.

Next, autozero switches 93, 94, and 95 are opened sequentially, allowing comparator stages 84 and 85 to sequentially settle out and thereby cancel out ground voltage errors and the like for each of the three comparator stages 83, 85, and 85 (FIG. 4).

Before a decision can be made by comparator 18-$i$, the CDAC (capacitor digital-to-analog converter) including capacitors 57A, 57B, 57C, and 57D must be operated to "sample" the analog input voltage $V_{IN}$. Switches 53, 54, and 55 connect the lower plates of capacitors 57B, 57C, and 57D to voltage $V_1$ while switch 21 is closed, so the voltage $V_1$ is stored on each of those three capacitors. At the same time switch 52 connects the bottom plate of capacitor 57A to $V_{IN}$, so $V_{IN}$ is sampled by the CDAC, and a corresponding voltage equal to $-(V_1+V_{IN})$ is produced on conductor 11 and applied to the input of source follower 14 after switch 21 is opened and the bottom plates of switches 52, 53, 54, and 55 are grounded.

Then, to obtain a decision by comparator 18-$i$, switches 52, 53, 54, and 55 are operated to connect the bottom plates of capacitors 57A-57D, respectively, to ground. (Note that capacitors 57A-57C are connected to ground through switches 41, 42, and 43 to resistor strings of reference DACs 22A, 22B, and 22C, respectively.) Switches 75 of FIGS. 3 and 4 are closed, applying $V_{REF4-i}$ to conductors 71-$i$. This produces on conductors 89 a voltage of approximately $$\frac{-V_1 - V_{IN} + V_{REF4-i}}{2}. \tag{1}$$

This expression arises because $V_{REF4-i}$ is a positive voltage applied by conductor 71-$i$ to the left terminal of $C_R$, and a negative voltage of magnitude $V_{IN}+V_1$ stored on capacitors 57A, 57B, 57C, and 57D is applied to conductor 11 by grounding of switches 52, 53, 54, and 55, and this results in a charge sharing that in effect produces a subtraction of one of these voltages from the other on conductors 89.

If the voltage $V_1+V_{IN}$ exceeds $V_{REF4-i}$, the value of expression (1) is negative and comparator 18-$i$ produces a "0" output level on conductor 80-$i$, but otherwise produces a "1" level. The effect of comparator decisions for all of the comparators 18-$i$ in comparator bank 18 is to produce a code on conductors 80 that corresponds to the value of $V_{IN}+V_1$ that is closest to but does not exceed $V_{REF4-i}$. That code is encoded by circuit 60 to produce an equivalent three bit binary number on conductors 40A. That three bit binary number is converted by DAC 22A to produce on conductor 3, and hence on conductor 11, the residual voltage $$V_{RES1} = -(V_1+V_{IN}) + V_{DAC1}, \tag{2}$$

where $V_{DAC1}$ is the analog output voltage produced by three bit DAC 22A during the first pass.

Switch 21 remains open and the above procedure is repeated for a second pass except that $V_{REF5-i}$ is applied to conductors 71-$i$ and the digital-to-analog conversion is performed by DAC 22B, to produce on conductor 89 the voltage $$\frac{V_{RES1} + V_{REF5-i}}{2}. \tag{3}$$

The residual voltage $$V_{RES2} = -(V_1+V_{IN}) + V_{DAC1} + V_{DAC2} \tag{4}$$

is produced on conductors 3 and 11, where $V_{DAC2}$ is the analog output voltage produced by three bit DAC 22B for the second pass. For the third pass, three bit DAC 22C and reference voltage $V_{REF6-i}$ are used, and the expression $$\frac{V_{RES2} + V_{REF6-i}}{2} \quad (5)$$

is produced on conductor 89. The voltage $$V_{RES3} = -(V_1 + V_{IN}) + V_{DAC1} + V_{DAC2} + V_{DAC3}. \quad (6)$$

is produced on conductor 11.

After the fourth pass through the comparators, no further conversion is needed, and the four three bit digital words that have been produced on three bit bus 40A constitute the most significant three bits, the next most significant three bits, etc. of the desired twelve bit word stored in block 62.

This circuit and technique provide high analog-to-digital conversion accuracy because the inputs of comparator 18-i cause switching of comparator 18-i with variations about ground only, rather than about higher or lower reference voltages. This has the advantage of avoiding common mode rejection problems.

The above-described analog-to-digital converter allows implementation of a twelve bit analog-to-digital converter on an integrated circuit chip only 240 mils square, with performance of approximately 2 million twelve bit samples per second. This is twice the rate of the closest prior art, which produces twelve bit outputs at the rate of a million samples per second on a chip that is 300 mils square. Furthermore, no calibration logic or calibration cycle is needed.

While the invention has been described with reference to several particular embodiments thereof, those skilled in the art will be able to make the various modifications to the described embodiments of the invention without departing from the true spirit and scope of the invention. It is intended that all combinations of elements and steps which perform substantially the same function in substantially the same way to achieve the same result are within the scope of the invention. For example, the gain of amplifier 14 could be other than unity if it is fast enough and inexpensive enough. Different numbers of DAC's such as 22A, 22B with different numbers of bits in combination with different numbers of passes could be used.

What is claimed is:

1. A high speed analog-to-digital converter comprising in combination:
   (a) a unity gain amplifier;
   (b) a flash encoder having a plurality of inputs all connected to an output of the amplifier;
   (c) a plurality of voltage reference circuits each producing a different group of selectable reference voltages during a plurality of successive approximation passes through the analog-to-digital converter, respectively, corresponding reference voltages produced by each of the voltage reference circuits being successively lower during each of the successive passes;
   (d) means for conducting the reference voltages to corresponding threshold inputs of a plurality of comparators contained in the flash encoder, respectively;
   (e) means for encoding output signals of the flash encoder to produce different binary words during the successive passes, respectively;
   (f) a plurality of digital-to-analog converters receiving and converting the binary words during the successive passes, respectively;
   (g) means for summing analog output signals of the digital-to-analog converter with an analog input signal and applying a resulting residual signal to an input of the amplifier, binary representations of the output signals of the comparator during the various passes forming a single binary output word.

2. The high speed analog-to-digital converter of claim 1 including means for combining binary representations of the output signals of the comparator during the various passes to form the binary output word.

3. The high speed analog-to-digital converter of claim 1 wherein the reference voltages produced by each of the reference voltage circuits determine a plurality of voltage windows of the output signals of the comparators during the various passes, the reference voltages of each group of reference voltages except the first being derived from the smallest reference voltage of the group of reference voltages used during the previous pass.

4. The high speed analog-to-digital converter of claim 3 wherein element (e) includes four three-bit digital-to-analog converters.

5. The high speed analog-to-digital converter of claim 3 including four voltage reference circuits each producing seven reference voltages, each reference circuit including seven switches for selecting the seven reference voltages to be applied to the threshold inputs of corresponding comparators.

6. The high speed analog-to-digital converter of claim 5 wherein each of the reference voltage circuit includes eight series-connected resistors the junctions of which produce the seven reference voltages.

7. The high speed analog-to-digital converter of claim 1 wherein the unity gain amplifier is a CMOS amplifier and wherein the comparators are CMOS comparators.

8. A method for high speed conversion of an analog input signal to a digital output word, the method comprising the steps of:
   (a) applying the analog input signal to an input of an amplifier of low voltage gain;
   (b) during a first pass, applying an output signal produced by the amplifier to inputs of each of a plurality of comparators;
   (c) during step (b), applying a first group of successively larger reference voltages to reference inputs of the comparators, respectively, a plurality of the comparators switching in response thereto to produce output signals indicative of a voltage rang within which the output signal of the amplifier lies;
   (d) encoding output signals of the comparators;
   (e) converting the encoded output signals to an analog signal representative of the output signal of the amplifier;
   (f) comparing the analog signal to the analog input signal and applying a difference therebetween to the input of the amplifier;
   (g) repeating steps (b)–(f) during another pass, and in step (c), applying another group of the reference voltages each substantially lower than corresponding values thereof during the previous pass, and in step (e), scaling down the analog signals to successively lower levels with each successive pass;

(h) combining binary representations of the output signals of the comparators during each of the passes into the digital output word.

9. The method of claim 8 wherein the encoding of step (d) includes converting the output signals to a switch selection signal for selecting one of a plurality of groups of level selection switches that selectively connect a plurality of groups of predetermined reference voltages to reference inputs of the various comparators, respectively.

10. The method of claim 9 including producing the predetermined reference voltages of each group by means of a plurality of resistive voltage divider circuits, respectively.

11. The method of claim 8 wherein step (g) includes encoding the output signals of the comparators to produce binary groups of bits representative of magnitudes of the output signals of the comparators, respectively, during each pass and storing the binary groups of bits, and after a last pass, using all of the stored binary groups of bits as the complete digital output word.

12. The method of claim 8 wherein the converting of step (c) includes applying the encoded signals to a plurality of groups of level selection switches each coupled to a different predetermined analog voltage level representative of a possible state of the encoded signals, respectively.

13. The method of claim 12 including producing each of the predetermined analog voltage levels of each group by means of a resistive voltage divider, wherein a first reference voltage is applied across the resistive voltage divider of the first of the groups, and a second voltage equal to one of the predetermined analog voltage levels of the first group is applied across the voltage divider of the second group.

14. A system for high speed conversion of an analog input signal to a digital output word, the system comprising in combination:
(a) a low gain amplifier and means for applying the analog input signal to an input of the low gain amplifier;
(b) a plurality of comparators;
(c) means for applying an output signal produced by the amplifier to inputs of each of the comparators during a first pass;
(d) means for applying a first group of successively larger reference voltages to reference inputs of the comparators, respectively, a plurality of the comparators switching in response to the output signal of the amplifier to produce output signals indicative of a range within which the output signal of the amplifier lies;
(e) means for encoding the outputs of the comparators;
(f) means for converting the encoded output signals to an analog signal representation of the output signal of the amplifier;
(g) means for comparing the analog signal to the analog input signal and applying a difference therebetween to the input of the amplifier;
(h) means for applying another group of the reference voltages during another pass, each of the reference voltages being substantially lower than corresponding values thereof during a previous pass;
(i) means for scaling down the analog signals to successively lower levels with each successive pass;
(j) means for combining binary representations of the outputs of the comparators during each of the passes to produce the digital output word.

15. The system of claim 14 including seven comparators, each of which is a CMOS comparator.

16. The system of claim 14 wherein the amplifier is a source follower.

17. The system of claim 14 wherein element (d) includes a plurality of reference voltage circuits equal in number to the number of passes required to obtain the digital output word, each reference voltage circuit including a resistive voltage divider producing a plurality of the successively larger reference voltages, a lowest reference voltage of each of the groups except the last group being applied across the resistive voltage divider of an immediately succeeding group.

18. The system of claim 15 wherein each of the comparators includes a first capacitor having a first terminal coupled to receive a reference voltage, a second capacitor having a first terminal coupled to receive the output signal of the amplifier, a second terminal of the first and second capacitors being coupled to a first input of the comparator, a second input of the comparator being connected to a ground reference voltage conductor.

19. The system of claim 18 including first and second autozeroing switches connected to first and second terminals of the first capacitor, respectively, and means for grounding the second terminal to allow a reference voltage to charge the first capacitor, and means for grounding the first terminal of the first capacitor to allow capacitive voltage division of the output signal of the amplifier across the first and second capacitors.

* * * * *